US008847965B2

(12) United States Patent
Chandak et al.

(10) Patent No.: US 8,847,965 B2
(45) Date of Patent: Sep. 30, 2014

(54) METHODS, SYSTEMS, AND COMPUTER READABLE MEDIA FOR FAST GEOMETRIC SOUND PROPAGATION USING VISIBILITY COMPUTATIONS

(75) Inventors: Anish Chandak, Carrboro, NC (US); Lakulish Shailesh Antani, Chapel Hill, NC (US); Micah Taylor, Pittsboro, NC (US); Dinesh Manocha, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 156 days.

(21) Appl. No.: 13/373,901

(22) Filed: Dec. 5, 2011

(65) Prior Publication Data

US 2012/0249556 A1    Oct. 4, 2012

Related U.S. Application Data

(60) Provisional application No. 61/419,781, filed on Dec. 3, 2010.

(51) Int. Cl.
*G06T 13/00* (2011.01)
*G06F 17/50* (2006.01)
*G06T 15/40* (2011.01)
*G06T 13/40* (2011.01)

(52) U.S. Cl.
CPC ............ *G06T 13/00* (2013.01); *G06F 17/5009* (2013.01); *H04S 2400/11* (2013.01); *G06T 15/40* (2013.01); *G06T 13/40* (2013.01)
USPC ........................................................ 345/473

(58) Field of Classification Search
CPC ....................................................... G06T 13/00
USPC ........................................................... 345/473
See application file for complete search history.

(56) References Cited

U.S. PATENT DOCUMENTS

| | | | |
|---|---|---|---|
| 6,259,452 B1 * | 7/2001 | Coorg et al. | 345/421 |
| 6,751,322 B1 * | 6/2004 | Carlbom et al. | 381/63 |
| 8,214,179 B2 * | 7/2012 | Carlbom et al. | 703/2 |
| 2011/0081023 A1 * | 4/2011 | Raghuvanshi et al. | 381/17 |
| 2013/0207976 A1 * | 8/2013 | Jenkins | 345/420 |

OTHER PUBLICATIONS

Paul T. Calamia and U. Peter Svensson, Fast Time-Domain Edge-Diffraction Calculations for Interactive Acoustic Simulations, Oct. 16, 2006, Hindawi Publishing Corporation, EURASIP Journal on Advances in Signal Processing, Volumne 2007, Article ID 63560, 10 pages.*

(Continued)

*Primary Examiner* — David T Welch
*Assistant Examiner* — Yuehan Wang
(74) *Attorney, Agent, or Firm* — Jenkins, Wilson, Taylor & Hunt, P.A.

(57) ABSTRACT

Methods, systems, and computer program products for simulating sound propagation can be operable to define a sound source position within a modeled scene having a given geometry and construct a visibility tree for modeling sound propagation paths within the scene. Using from-region visibility techniques to model sound diffraction and from-point visibility technique to model specular sound reflections within the scene, the size of the visibility tree can be reduced. Using the visibility tree, an impulse response can be generated for the scene, and the impulse response can be used to simulate sound propagation in the scene.

23 Claims, 13 Drawing Sheets

(56) References Cited

OTHER PUBLICATIONS

Anish Chandak et al., AD-Frustum: Adaptive Frustum Tracing for Interactive Sound Propagation, IEEE Transactions on Visualization and Computer Graphics, vol. 14, No. 6, Nov./Dec. 2008, p. 1707-1714.*

Thomas Funkhouser et al., A beam tracing method for interactive architectural acoustics, Copyright 2004 Acoustical Society of America, Aug. 25, 2003, p. 739-756.*

Samuli Laine et al., Accelerated beam tracing algorithm, ScienceDirect, Applied Acoustics 70 (2009), p. 172-181.*

Samuel Siltanen et al., The room acoustic rendering equation, Jul. 5, 2007, Copyright 2007 Acoustical Society of America, 122 (3), Sep. 2007, p. 1624-1635.*

Akenin-Moller et al., "Conservative and Tiled Rasterization Using a Modified Triangle Setup,"Journal of Graphics Tools, vol. 10, No. 3, pp. 1-7 (2005).

Allen et al., "Image method for efficiently simulating small-room acoustics," Journal of the Acoustical Society of America, vol. 65, No. 4, pp. 943-950 (Apr. 1979).

Antonacci et al., "Fast Modeling of Acoustic Reflections and Diffraction in Complex Environments Using Visibility Diagrams," Proceedings of 12th European Signal Processing Conference, pp. 1773-1776 (2004).

Begault, "3-D Sound for Virtual Reality and Multimedia," NASA/TM—2000—000000, pp. 1-246 (Apr. 2000).

Bertram et al., "Phonon Tracing for Auralization and Visualization of Sound," Proceedings of IEEE Visualization, pp. 151-158 (2005).

Biot et al., "Formulation of Wave Propagation in Infinite Media by Normal Coordinates with an Application to Diffraction," The Journal of the Acoustical Society of America, vol. 29, No. 3. pp. 381-391 (Mar. 1957).

Bittner et al., "Adaptive Global Visibility Sampling," SIGGRAPH '09: ACM SIGGRAPH, pp. 1-10 (2009).

Bittner et al., "Fast Exact From-Region Visibility Sampling in Urban Scenes," Eurographics Symposium on Rendering, pp. 1-9 (2005).

Bittner et al., "Hierarchical Visibility Culling with Occlusion Trees," Proceedings of Computer Graphics International, pp. 207-219 (Jun. 1998).

Bittner et al., "Visibility in Computer Graphics," Environment and Planning B: Planning and Design, vol. 30, pp. 729-756 (2003).

Calamia et al., "Diffraction culling for virtual-acoustic simulations," The Journal of the Acoustical Society of America, pp. 2586-2586 (2009).

Calamia et al., "Edge Subdivision for Fast Diffraction Calculations," 2005 IEEE Workshop on Applications of Signal Processing to Audio and Acoustics, pp. 187-190 (2005).

Calamia et al., "Fast Time-Domain Edge-Diffraction Calculations for Interactive Acoustic Simulations," EURASIP Journal on Advances in Signal Processing, vol. 2007, Article 63560, pp. 1-33 (2007).

Calamia et al., "Integration of edge diffraction calculations and geometrical-acoustics modeling," Proceedings of Forum Acusticum, pp. 1-6, (2005).

Chambers et al., "Time-domain experiments on the diffraction of sound by a step discontinuity," Journal of the Acoustical Society of America, vol. 96, No. 3, pp. 1887-1892 (Sep. 1994).

Chandak et al., "AD-Frustum: Adaptive Frustum Tracing for Interactive Sound Propagation," IEEE Transactions on Visualization and Computer Graphics, pp. 1-8 (Oct. 27, 2007).

Chandak et al., "FastV: From-point Visibility Culling on Complex Models," Computer Graphics Forum, vol. 28, No. 4, pp. 1237-1246 (2009).

Chhugani et al., "vLOD: High-Fidelity Walkthrough of Large Virtual Environments," IEEE Transactions on Visualization and Computer Graphics, vol. 11, No. 1, pp. 35-47 (Jan./Feb. 2005).

Cohen-Or et al., "A Survey of Visibility for Walkthrough Applications," IEEE Transactions on Visualization and Computer Graphics, vol. 9, No. 3, pp. 412-431 (Jul.-Sep. 2003).

Coorg et al., "Real-Time Occlusion Culling for Models with Large Occluders," Symposium on Interactive 3D Graphics, pp. 83-90 (Apr. 1997).

Dalenback, "Room acoustic prediction based on a unified tretment of diffuse and specular reflection," The Journal of the Acoustical Society of America, vol. 100, No. 2, Pt. 1, pp. 899-909 (Aug. 1996).

Duguet et al., "Robust Epsilon Visibility," Proc. of ACM SIGGRAPH, pp. 567-575 (2002).

Durand et al., "Conservative Visibility Preprocessing Using Extended Projections," SIGGRAPH '00: Proceedings of the 27th Annual Conference on Computer Graphics and Interactive Techniques, pp. 1-13 (2000).

Durand et al., "The 3d visibility complex: a new approach to the problems of accurate visibility," Proceedings of the Eurographics Workshop on Rendering Techniques '96, pp. 245-256 (1996).

Durand et al., "The Visibility Skeleton: A Powerful and Efficient Multi-Purpose Global Visibility Tool," SIGGRAPH '97: Proceedings of the 24th Annual Conference on Computer Graphics and Interactive Techniques, pp. 89-100.

Funkhouser et al., "A Beam Tracing Approach to Acoustic Modeling for Interactive Virtual Environments," Proc. of ACM SIGGRAPH, pp. 21-32 (1998).

Funkhouser et al., "A beam tracing method for interactive architectural acoustics," Journal of the Acoustical Society of America, pp. 739-756 (Feb. 2004).

Ghali, "A Survey of Practical Object Space Visibility Algorithms," SIGGRAPH, pp. 1-14 (2001).

Gigus et al., "Efficiently Computing and Representing Aspect Graphs of Polyhedral Objects," IEEE Transactions on Pattern Analysis Machine Intelligence, vol. 13, No. 6, pp. 542-551 (Jun. 1991).

Hasenfratz et al., "A Survey of Real-Time Soft Shadows Algorithms," Eurographics, vol. 22, No. 4, pp. 753-774 (2003).

Heckbert et al., "Beam Tracing Polygonal Objects," Proc. of ACM SIGGRAPH, pp. 1-23 (1984).

Hudson et al., "Accelerated Occlusion Culling using Shadow Frusta," Proc. of ACM Symposium on Computational Geometry, pp. 1-10 (1997).

Kajiya, "The Rendering Equation," Proc. of ACM SIGGRAPH, vol. 20, No. 4, pp. 143-150 (1986).

Kapralos et al., "Sonel Mapping: Acoustic Modeling Utilizing an Acoustic Version of Photon Mapping," IEEE International Workshop on Haptics Audio Visual Environments and their Applications, pp. 2-3 (2004).

Klosowski et al., "The Prioritized-Layered Projection Algorithm for Visible Set Estimation," IEEE Transactions on Visualization and Computer Graphics, vol. 6, No. 2, pp. 108-123 (Apr.-Jun. 2000).

Kolton et al., "Hardware-accelerated from-region visibility using a dual ray space," Proceedings of the 12th Eurographics Workshop on Rendering Techniques, pp. 205-216 (2001).

Koltun et al., "Virtual Occluders: An Efficient Intermediate PVS Representation," Eurographics Workshop on Rendering, pp. 1-12 (2000).

Koltun et al., "Selecting Effective Occluders for Visibility Culling," Eurographics, pp. 1-5 (2000).

Kouyoumijian et al., "A Uniform Geometrical Theory of Diffraction for an Edge in a Perfect Conducting Surface," Proceedings of the IEEE, vol. 62, No. 11, pp. 1448-1461 (Nov. 1974).

Krokstad et al., "Calculating the Acoustical Room Response by the Use of a Ray Ttracing Technique," Journal of Sound and Vibration, vol. 8, No. 1, pp. 118-125 (Jul. 1968).

Laine et al., "Accelerated beam tracing algorithm," Applied Acoustics, vol. 70, pp. 172-181 (2009).

Laine, "An Incremental Shaft Subdivision Algorithm for Computing Shadows and Visibility," Master's Thesis, Helsinki University of Technology (Mar. 29, 2006).

Lauterbach et al., "Adaptive sampling for frustum-based sound propagation in complex and dynamic environments," Proceedings of the 19th International Congress on Acoustics, pp. 1-6, (Sep. 2007).

Lauterbach et al., "Interactive Sound Rendering in Complex and Dynamic Scenes sing Frustum Tracing," IEEE Transactions on Visualization and Computer Graphics, vol. 13, No. 6, pp. 1672-1679 (Nov.-Dec. 2007).

(56) References Cited

OTHER PUBLICATIONS

Law et al., "Preprocessing Occlusion for Real-Time Selective Refinement," 1999 Symposium on Interactive 3D Graphics, pp. 47-53 (1999).
Lehtinen, "Time-domain Numerical Solution of the Wave Equation," pp. 1-17 (Feb. 6, 2003).
Leyvand et al., "Ray Space Factorization for From-Region Visibility," ACM Transactions on Graphics, pp. 595-604 (Jul. 2003).
Lloyd et al., "Warping and Partioning for Low Error Shadow Maps," Proceedings of the Eurographics Symposium on Rendering, pp. 1-13 (2006).
Luebke et al., "Portals and Mirrors: Simple, Fast Evaluation of Potentially Visible Sets," ACM Interactive 3D Graphics Conference, pp. 105-108 (1995).
Mattausch et al., "CHC++: Coherent Hierarchical Culling Revisited," Proc. of Eurographics Workshop on Rendering, vol. 27, No. 3, pp. 221-230 (2008).
Medwin et al., "Impulse studies of double diffraction: A discrete Huygens interpretation," The Journal of the Acoustical Society of America, pp. 1005-1013 (Sep. 1982).
Navazo et al., "ShieldTester: Cell-to-cell visibility test for surface occluders," Proc. of Eurographics, pp. 291-302 (2003).
Nirenstein et al., "Exact From-Region Visibility Culling," Thirteenth Eurographics Workshop on Rendering, pp. 191-202 (2002).
Nirenstein et al., "Hardware Accelerated Visibility Preprocessing using Adaptive Sampling," Eurographics Symposium on Rendering (2004).
Nirenstein, "Fast and Accurate Visibility Preprocessing," Dissertation, University of Cape Town, South Africa (2003).
"Nvidia occlusion query," http://oss.sgi.com/projects/ogi-sample/registry/NV/occlusion_query.txt (2002).
Overbeck et al., "A Real-time Beam Tracer with Application to Exact Soft Shadows," Eurographics Symposium on Rendering, pp. 85-98 (Jun. 2007).
Owens et al., "A Survey of General-Purpose Computation on Graphics Hardware," Computer Graphics Forum, vol. 26, No. 1, pp. 80-113 (2007).
Pulkki et al., "Visualization of edge diffraction," Acoustics Research Letters Online, vol. 4, No. 4, pp. 118-123 (2002).
Raghuvanshi et al., "Accelerated Wave-Based Acoustics Simulation," SPM '08: Proceedings of the 2008 ACM Symposium on Solid and Physical Modeling, pp. 91-102 (2008).
Reshetov et al., "Multi-Level Ray Tracing Algorithm," ACM Trans. Graph., pp. 1176-1185 (2005).
Schaufler et al., "Conservative Volumetric Visibility with Occluder Fusion," SIGGRAPH 2000, Computer Graphics Proceedings, pp. 229-238 (2000).
Shoemake, "Pluecker Coordinate Tutorial," Ray Tracing News 11 (1998).
Siltanen et al., "The room acoustic rendering equation," The Journal of the Acoustical Society of America, pp. 1624-1635 (Sep. 2007).
Svensson et al., "An analytic secondary source model of edge diffraction impulse responses," Acoustical Society of America Journal, vol. 106, No. 5, pp. 2331-2344 (Nov. 1999).
Svensson, "Edge Diffraction Toolbox," pp. 1-2 (1999).
Taylor et al., "Fast Edge-Diffraction for Sound Propagation in Complex Virtual Environments," EAA Auralization Symposium, pp. 1-6 (Jun. 2009).
Taylor et al., "iSound: Interactive GPU-based Sound Auralization in Dynamic Scenes," Technical Report TR 10-006, University of North Carolina at Chapel Hill, pp. 1-10 (2010).
Teller et al., "Computing the Antipenumbra of an Area Light Source," SIGGRAPH '92: Proceedings of the 19th Annual Conference on Computer Graphics and Interactive Techniques, pp. 139-148 (1992).
Teller et al., "Visibility Preprocessing for Interactive Walkthroughs," SIGGRAPH Comput. Graph., pp. 61-70 (1991).
Teller, "Visibility Computations in Densely occluded Polyheral Environments," PhD thesis, CS Division, UC Berkeley (1992).
Theoharis et al., "The Magic of the Z-Buffer: A Survey," Proc. of 9th International Conference on Computer Graphics, Visualization and Computer Vision, WSCG (2001).
Torres et al., "Computation of edge diffraction for more accurate room acoustics auralization," The Journal of the Acoustical Society of America, pp. 600-610 (2001).
Tsingos et al., "Modeling Acoustics in Virtual Environments Using the Uniform Theory of Diffraction," pp. 1-9 (2001).
Tsingos et al., "Instant Sound Scattering," Rendering Techniques (Proceedings of the Eurographics Symposium on Rendering) (2007).
Vorlander, "Simulation of the transient and steady-state sound propagation in rooms using a new combined ray-tracing/image-source algorithm," The Journal of the Acoustical Society of America, pp. 172-178 (1989).
Wald et al., "State of the Art in Ray Tracing Dynamic Scenes," Eurographics State of the Art Reports, pp. 1-28, (2007).
Wonka et al., "Guided Visibility Sampling," SIGGRAPH '06: ACM SIGGRAPH 2006 Papers, pp. 494-502 (2006).
Wonka et al., "Visibility Preprocessing with Occluder Fusion for Urban Walkthroughs," pp. 1-12 (2000).
Yin et al., "Generating 3D Builing Models from Architectural Drawings: A Survey," IEEE Computer Society, pp. 20-30 (Jan./Feb. 2009).
Arvo et al., "A Survey of Ray Tracing Acceleration Techniques," An Introduction to Ray Tracing, pp. 201-262 (1989).
Dalenbäck et al., "A Macroscopic View of Diffuse Reflection," J. Audio Eng. Soc., vol. 42, No. 10, pp. 793-807 (Oct. 1994).
Durand, "3D Visibility: Analytical Study and Applications," pp. 1-305 (1999).
Funkhouser et al., "Survey of Methods for Modeling Sound Propagation in Interactive Virtual Environment Systems," http://www.cs.princeton.edu/~funk/presence03.pdf, Presence and Teleoperation, pp. 1-53 (2003).
Lehnert, "Systematic Errors of the Ray-Tracing Algorithm," Applied Acoustics, vol. 38, pp. 207-221 (1993).
Lensch et al., "FastV: From point Visibility Culling on Complex Models," Eurographics Symposium on Rendering, vol. 28, No. 4. pp. 1-8 (2009).
Pulkki et al., "Implementation and visualization of edge diffraction with image source method," In Proceedings of the 112th AES Convention, pp. 1-13 (May 10-13, 2002).
Schroder et al., "Real-Time Hybrid Simulation Method Including Edge Diffraction," Proc. of the EAA Symposium on Auralization, pp. 1-6 (Jun. 15-17, 2009).
Schröder et al., "Real-Time Processing of Image Sources Using Binary Space Partioning," Journal of the Audio Engineering Society, vol. 54, No. 7/8, pp. 604-619 (Jul./Aug. 2006).
Shirley et al., "State of the Art in Interactive Ray Tracing," SIGGRAPH Course Notes (2006).
Siltanen et al., "Frequency Domain Acoustic Radiance Transfer for Real-Time Auralization," Acta Acustica United with Acustica, vol. 95, pp. 106-117 (2009).
Svensson et al., "Edge-Diffraction Impulse Responses Near Specular-Zone and Shadow-Zone Boundaries," Acta Acustica United with Acustica, vol. 92, pp. 501-512 (2006).
Svensson et al., "Computation Modelling and Simulation of Acoustic Spaces," AES 22nd International Conference on Virtual, Synthetic and Entertainment Audio, pp. 1-20 (2002).

\* cited by examiner

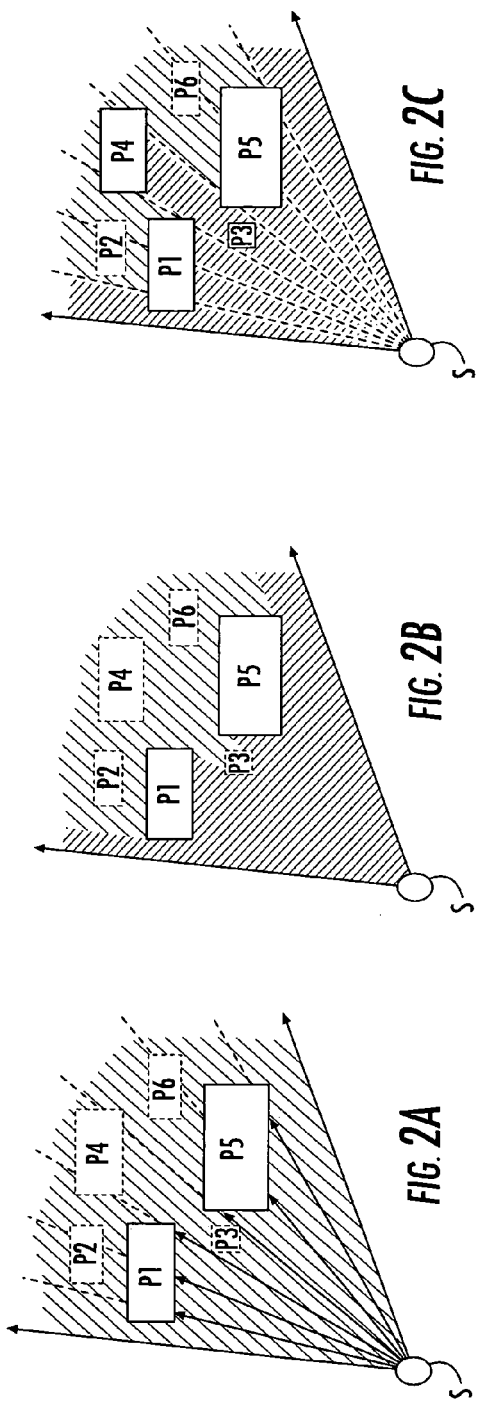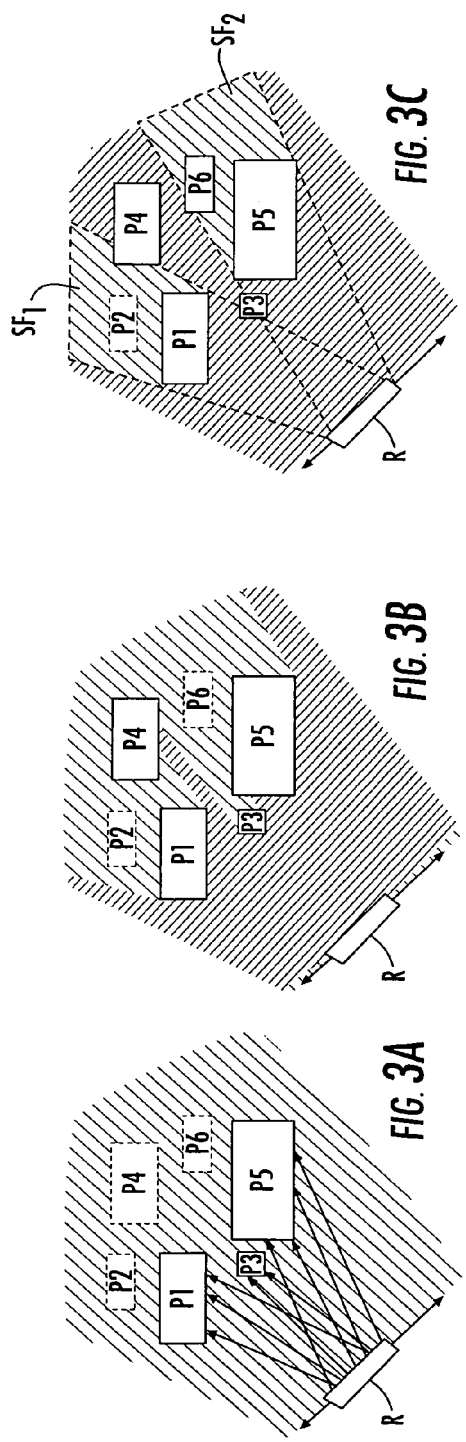

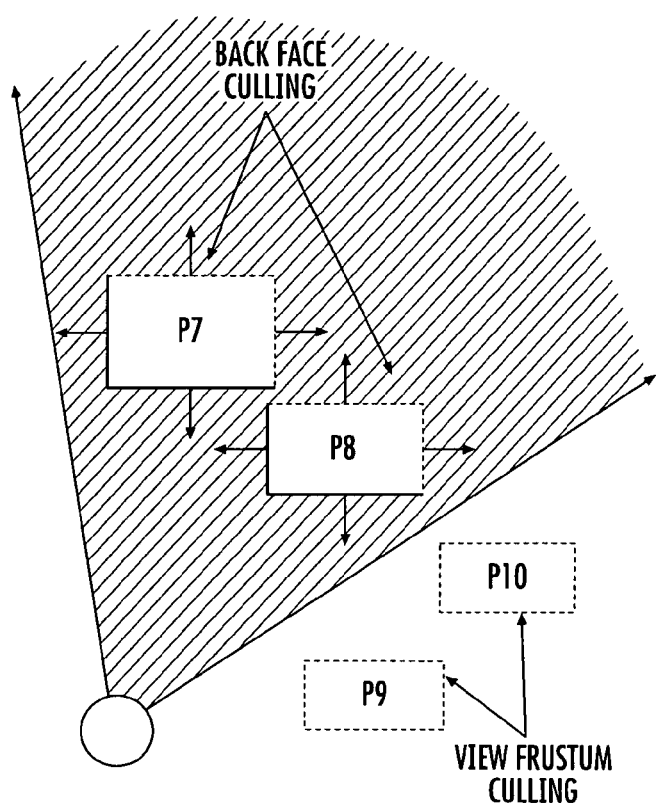
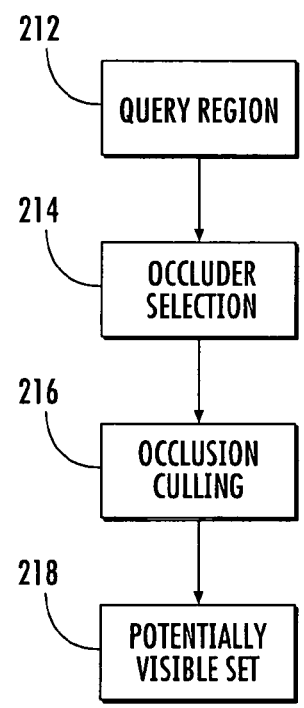
FIG. 4
FIG. 5

United States Patent US 8,847,965 B2

METHODS, SYSTEMS, AND COMPUTER READABLE MEDIA FOR FAST GEOMETRIC SOUND PROPAGATION USING VISIBILITY COMPUTATIONS

PRIORITY CLAIM

This application claims the benefit of U.S. Provisional Patent Application Ser. No. 61/419,781, filed Dec. 3, 2010, the disclosure of which is incorporated herein by reference in its entirety.

GOVERNMENT INTEREST

This invention was made with government support under Grant No. W911NF-04-1-0088 awarded by Army Research Office, Grant Nos. OCI-0636208, IIS-0917040, and 0904990 awarded by National Science Foundation, and Grant No. W91CRB-08-C-0137 awarded by U.S. Army. The government has certain rights in the invention.

TECHNICAL FIELD

The subject matter disclosed herein relates generally to methods and systems for modeling sound propagation in a scene. More particularly, the subject matter disclosed herein relates to methods and systems for simulating sound propagation using geometric acoustic algorithms.

BACKGROUND

Sound rendering or auditory displays can augment graphical rendering and provide the user with an enhanced spatial sense of presence. Some of the driving applications of sound rendering include acoustic design of architectural models or outdoor scenes, walkthroughs of large CAD models with sounds of machine parts or moving people, urban scenes with traffic, training systems, computer games, etc. A key component in these applications is accurate computation of sound propagation paths, which takes into account the knowledge of sound sources, listener locations, the 3D model of the environment, and material absorption and scattering properties.

The propagation of sound in a medium is governed by the acoustic wave equation, a second-order partial differential equation. However, numerical methods that directly solve the acoustic wave equation can take tens of minutes even for simple rooms. Moreover, for numerical methods, the computation time grows as a fourth power of the maximum frequency simulated, and is proportional to the volume of the enclosed space. Hence they can only be used for small rooms and for low frequencies.

On the other hand, fast sound propagation methods are based on geometric acoustic (GA) algorithms, such as ray tracing or volumetric tracing. These geometric acoustics (GA) techniques are not as accurate as numerical methods in terms of solving the wave equation, and cannot easily model all kinds of propagation effects, but they allow simulation of early reflections at real-time rates. These methods work well in terms of handling specular reflections, and can take advantage of recent advances in real-time ray tracing methods and multi-core processors. However, current geometric propagation methods are either not fast enough for interactive applications or may not compute all propagation paths accurately. As a result, interactive applications such as computer games tend to use statically designed environment reverberation filters. Some games use ray tracing to estimate the size of a room and use this information to set parameters for a reverberation filter. Games also use precomputed visibility to determine if a source is out of line of sight from the listener. This is usually performed at a coarse level (i.e., visibility can be determined at a room-to-room level of detail using cell-and-portal visibility or ray shooting). If the source is not visible, a low-pass filter is usually applied to approximate diffraction effects. However the direction is the direct line from source to listener, which leads to very unnatural sound which seems to emanate from solid walls.

Accordingly, it would be desirable for an improved method and system for modeling sound propagation to allow for faster computation of sound propagation paths.

SUMMARY

In accordance with this disclosure, methods, systems and computer readable media for simulating sound propagation in a scene are provided. In one aspect, a method for simulating sound propagation is provided. The method can comprise defining a sound source position within a modeled scene having a given geometry, constructing a visibility tree for modeling sound propagation paths within the scene, using a from-region visibility technique (e.g., with occlusion culling) to model sound diffraction within the scene and reduce the size of the visibility tree, using a from-point visibility technique (e.g., a conservative from-point visibility technique which performs occlusion culling) to model specular sound reflections within the scene and reduce the size of the visibility tree, using the visibility tree to generate an impulse response for the scene, and using the impulse response to simulate sound propagation in the scene.

In another aspect, a non-transitory computer readable medium is provided, the computer readable medium having stored thereon executable instructions that when executed by the processor of a computer control the computer to perform steps comprising defining a sound source position within a modeled scene having a given geometry, constructing a visibility tree for modeling sound propagation paths within the scene, using a from-region visibility technique (e.g., with occlusion culling) to model sound diffraction within the scene and reduce the size of the visibility tree, using a from-point visibility technique (e.g., a conservative from-point visibility technique which performs occlusion culling) to model specular sound reflections within the scene and reduce the size of the visibility tree, using the visibility tree to generate an impulse response for the scene, and using the impulse response to simulate sound propagation in the scene.

In a further aspect, a system for simulating sound propagation is provided. The system can comprise a fast geometric sound simulator for defining a sound position within a modeled scene having a given geometry, for constructing a visibility tree for modeling sound propagation paths within the scene, for using a from-region visibility technique (e.g., with occlusion culling) to model sound diffraction within the scene and reduce the size of the visibility tree, for using a from-point visibility technique (e.g., a conservative from-point visibility technique which performs occlusion culling) to model specular sound reflections within the scene and reduce the size of the visibility tree, and for using the visibility tree to generate an impulse response for the model. The system can further comprise a sound source for generating an input sound to the scene, wherein the sound simulator uses the impulse response to simulate a response of the scene to the input sound.

The subject matter described herein for simulating sound propagation in a scene can be implemented in software in combination with hardware and/or firmware. In one exemplary implementation, the subject matter described herein can be implemented using a non-transitory computer readable medium having stored thereon executable instructions that when executed by the processor of the computer control the computer to perform steps. Exemplary computer readable media suitable for implementing the subject matter described herein include disk memory devices, chip memory devices, application specific integrated circuits, and programmable logic devices. In addition, a computer readable medium that implements the subject matter described herein may be located on a single device or computing platform or may be distributed across plural devices or computing platforms.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIGS. 2a-2c are schematic representations of three from-point visibility algorithms that can be used with the methods and systems of the presently disclosed subject matter;

FIGS. 3a-3c are schematic representations of three from-region visibility algorithms that can be used with the methods and systems of the presently disclosed subject matter;

FIG. 4 is a schematic representation of view-frustum culling and back-face culling algorithms that can be used with the methods and systems of the presently disclosed subject matter;

FIG. 5 is a block diagram illustrating an exemplary method for occluder selection according to an embodiment of the presently disclosed subject matter;

DETAILED DESCRIPTION

Figure 1:
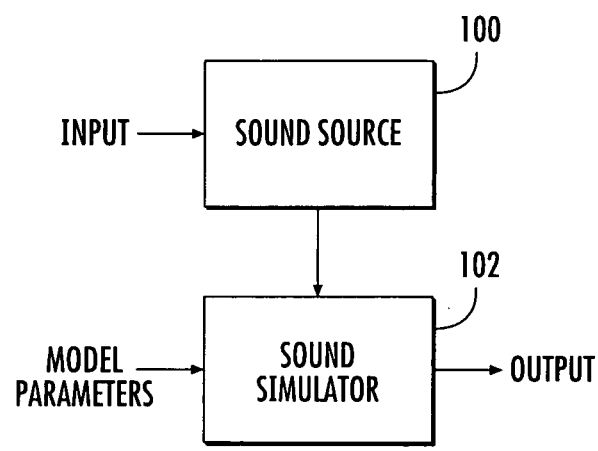
FIG. 1 is a block diagram illustrating an exemplary system for simulating sound propagation within the scene according to an embodiment of the presently disclosed subject matter.

The present subject matter provides methods, systems and computer readable media for simulating sound propagation in a scene. In one aspect illustrated in FIG. 1, an exemplary implementation of the subject matter described herein is provided. Referring to FIG. 1, a sound source 100 may be any suitable application that receives user input for sound to be generated. The sound source 100 may be a game or any other application for which it is desirable to generate a sound. A sound simulator 102 implements the subject matter described herein for fast geometric sound simulation. Sound simulator 102 receives model parameters and generates the impulse response of a model as described above. When sound simulator 102 receives the input sounds from sound source 100, sound simulator 102 generates an output sound based on the fast computation method described below.

In addition to gaming, other applications of the subject matter described herein include architectural design and acoustic engineering for entertainment and other applications. In one implementation, sound simulator 102 may be implemented as middle-ware that resides between an application, such as sound source 100, and the underlying hardware that executes sound simulator 102 and sound source 100.

In one implementation, sound simulator 102 may be implemented using a non-transitory computer readable medium having stored thereon executable instructions that when executed by the processor of a computer control the computer to perform steps. Exemplary computer readable media for implementing the subject matter described herein include chip memory devices, disk memory devices, programmable logic devices, and application specific integrated circuits. In addition, a computer readable medium that implements the subject matter described herein may be located on a single device or computing platform or may be distributed across plural devices or computing platforms.

Regardless of the specific implementation, the present methods and systems can use visibility algorithms to accelerate GA methods used for computing specular reflections and edge diffraction. In particular, the methods and systems described herein can comprise two object-space visibility algorithms which can be used for fast GA computations. First, a point-based conservative visibility algorithm can improve the computation of specular reflections using an image-source method.

A second object-space visibility algorithm for fast GA computations can be an algorithm that computes visibility from a given edge in the model and is used to accelerate the performance of higher order finite-edge diffraction. In the context of geometric propagation, two main approaches exist for modeling edge diffraction: the Uniform Theory of Diffraction (UTD) and the Biot-Tolstoy-Medwin (BTM) model. UTD models diffraction around an infinite edge in terms of a single virtual point source on the edge. While this makes it fast enough to be useful in interactive applications, it is an approximate method and may only work well for models with very large edges in outdoor scenes. On the other hand, BTM models diffraction around finite edges in terms of many virtual point sources located along the edge. Although this makes the resulting approach more computationally intensive than UTD, it has been shown to be more accurate than UTD at low frequencies, where diffraction effects play an important role.

Significant time savings can be obtained through the use of these visibility algorithms on complex models.

Visibility Techniques

Visibility techniques have been studied in computer graphics, computational geometry, robotics and related areas for more than four decades. The basic goal of visibility algorithms is to compute a set of primitives that are visible from a given view-point or view-region. Visibility algorithms can be classified in different ways. One way is to classify them into from-point and from-region visibility. FIGS. 2a-2c show examples of from-point visibility where the circle S represents the view-point. From-point visibility is used in computer graphics for generating the final image from the eye-point based on rasterization or ray tracing. Other examples of applications of from-point visibility include hard shadow computation for point light sources.

FIGS. 3a-3c show examples of from-region visibility, where the rectangular region R with the arrows denotes a view-region. From-region visibility has been used in a variety of applications such as computer graphics for global illumination (i.e., computing the multiple bounce response of light from light sources to the camera via reflections from primitives in the 3D model), interactive walkthroughs of complex 3D models (by prefetching a smaller set of potentially visible primitives from a region around the active camera position), and soft shadow computation from area light sources.

Given a view-point ($v \in \Re^3$, from-point) or a view-region ($v \subset \Re^3$, from-region), a set of geometry primitives ($\Pi$), and a viewing frustum ($\Phi$), which is a set of infinitely many rays originating in v, the goal of visibility techniques is to compute a set of primitives $\pi \subseteq \Pi$ hit by rays in $\Phi$. For example, in FIGS. 2a-2c, the circle S corresponds to the viewpoint, and in FIGS. 3a-3c, the rectangle R corresponds to the view-region. The set of primitives is $\Pi=\{P1, P2, P3, P4, P5, P6\}$ and the region shaded in light gray bounded by two arrows is spanned by rays in $\Phi$, the viewing frustum. In FIGS. 2a-2c the visible set of primitives $\pi=\{P1, P5\}$ and in FIGS. 3a-3c the visible set of primitives $\pi=\{P1, P3, P5\}$. Note that the set it is called the potentially visible set (PVS). Depending on the properties of the computed PVS, visibility techniques can be further classified.

Object-Space Exact Visibility

Exact visibility techniques compute a PVS, $\pi_{exact}$, hit by every ray in $\Phi$ and every primitive in $\pi_{exact}$ is hit by some ray in $\Phi$. Since every ray in $\Phi$ is considered to compute visibility, these techniques are called object-space techniques. Moreover, these intersection computations are performed at the accuracy of the original model (e.g. IEEE 64-bit double precision arithmetic). The PVS computed by an object-space exact visibility algorithm is the smallest PVS which contains all the primitives visible from v. Many applications require exact visibility with object space precision. For example, accurate computation of soft shadows due to area light source in computer graphics requires the computation of exact visible area from all the points of the area light source to compute the contribution of the area light source at the point. Similarly, computing hard shadows due to a point light source requires accurate computation of visible portions of primitives from the point light source or aliasing artifacts may appear.

FIG. 2b shows an example of exact from-point visibility. Primitives P1, P3, and P5 block all the rays in the viewing frustum starting at the view-point from reaching the primitives P2, P4, and P6. Thus, the primitives P2, P4, and P6 are marked as hidden. The two main approaches for computing exact from-point visibility are based on beam tracing. Beam tracing approaches shoot a beam from the view point and perform exact intersections of the beam with the primitives in the scene. As the beam hits the primitives, exact intersection and clipping computations are performed between the beam and the primitive. The portion of the beam which is not hit by any primitive so far is checked for intersections with the remaining primitives. Thus, the complexity of the shape of the beam may increase as more intersection computations are performed. In general, performing exact and robust intersection computations with the beam on complex 3D models is considered a hard problem.

Approaches based on Plücker coordinates perform constructive solid geometry (CSG) operations in Plücker space to compute exact visibility. Plücker space is a six-dimensional space with certain special properties. In this approach, the view frustum and the primitives are represented in Plücker space as CSG primitives and intersection computations are performed between the view-frustum and the primitives such that when the CSG intersection is transformed back into Euclidean space, it corresponds exactly to the visible primitives. The intersection between the view-frustum and primitives in Plücker space requires complex operations. Thus, these techniques can be used to perform exact from-point visibility computations, but can be expensive and susceptible to robustness problems.

FIG. 3b shows an example of from-region exact visibility. Primitives P1, P3, P4, and P5 are visible from the view-region. Note that no ray starting in the view region reaches P2 and P6, and therefore they are marked as hidden from the view-region. Many complex data structures and algorithms have been proposed to compute exact from-region visibility, including aspect graphs, visibility complex, and performing CSG operations in Plücker space. These methods have high complexity—$O(n^9)$ for aspect graphs and $O(n^4)$ for the visibility complex, where n is the number of geometry primitives—and are too slow to be of practical use on complex models.

Object-Space Conservative Visibility

Conservative visibility techniques compute a PVS, $\pi_{conservative}$, hit by at least every ray in $\Phi$. In addition, however, the PVS, $\pi_{conservative}$, may contain primitives which are not hit by any ray in $\Phi$. Thus, $\pi_{conservative}$ is conservative in that it errs on the side of over-inclusion of primitives (i.e., $\pi_{conservative} \supseteq \pi_{exact}$). Conservative from-point visibility algorithms are preferred for their computational efficiency and simplicity over exact algorithms. The two simple and widely used but highly conservative visibility techniques are view-frustum culling and back-face culling. They are used to trivially compute some of the hidden primitives. FIG. 4 illustrates these methods. In view-frustum culling, the primitives completely outside the view-frustum are marked hidden. In back-face culling, the primitives which are facing away from the view-point or view-region are marked as hidden. Conservative visibility is preferred in many applications mainly due to its ease of implementation and good performance improvement.

The choice between a conservative or an exact object-space algorithm is decided by the application on the basis of the trade-off between the overhead of extra visible primitives due to the conservative algorithm vs. the time overhead of the exact algorithm.

FIG. 2c shows an example of the PVS computed by a conservative from-point visibility algorithm referred to as "FastV." In this algorithm, many small frusta are shot from the view-point and a frustum stops when it is entirely blocked by primitives. It is noted that primitive P4, which is not visible from the view-point, is still reported as potentially visible by the present conservative approach. Primitives P2 and P6 remain hidden from the view-point. Many other techniques have been developed for conservative from-point visibility computations. Many of these algorithms have been designed for special types of models, however, such as architectural models represented as cells and portals, 2.5D urban models, or scenes with large convex primitives. These methods are well suited when the target application of the visibility algorithms is limited to urban scenes or architectural models corresponding to buildings or indoor structures with no interior primitives or furniture. In contrast, the present FastV algorithm is general and can handle all kinds of scenes.

FIG. 3c demonstrates a conservative from-region visibility algorithm. The basic idea is to construct shadow frusta SF (polyhedral beams contained within the umbrae between the view-region and primitives) for selected primitives. Typically, these primitives are selected by an occluder selection algorithm based on their effectiveness in removing hidden primitives. Primitives which are completely inside the shadow frusta SF are marked as hidden. In this regard, FIG. 3c shows that only the primitive P2 is completely inside shadow frusta SF1 and SF5 of primitives P1 and P5, respectively. Also, it is noted that primitive P6 is marked as potentially visible by the present approach even though there is no ray originating in the view-region which reaches P6.

Regarding occluder selection, one option can be to simply use every primitive in the scene as an occluder, and use an occlusion culling algorithm that handles occluder fusion. In an ideal scenario, such an approach would result in a PVS that is as close as possible to $\pi_{exact}$ exact. However, the main issue with such an approach, which limits its practical application, is that the cost of occlusion culling is typically a function of the number of occluders. Most prior work on occluder selection uses heuristics based on distance, solid angles, or area of primitives. Although these methods compute a subset of Π to be used as occluders, they are unable to exploit the connectivity information of primitives to find any arbitrary set of connected triangles as occluders. If small occluders are combined into large occluders, the culling efficiency of the visibility algorithm can be improved.

Thus, the methods and system according to the present subject matter can use a from-region occluder selection algorithm which exploits the connectivity information between scene primitives whenever feasible. This approach is general and applicable to all kinds of models including "polygon soup" models. No assumptions are made about the model or the connectivity of the polygons (e.g., in one implementation, the models can be assumed to be triangulated, but this is not a restriction imposed by the present algorithm). If the model connectivity information is given or can be extracted, this algorithm can exploit that information to compute large occluders formed by connected sets of primitives.

One algorithm that can be used to compute the occluders from a given region is shown generally in FIG. 5. In a first step 212, a query region R can be defined. Next, occluders can be chosen for query region R in a second step 214. In a third step 216, the occluders can be used to compute which primitives are hidden from R by the occluders. The set of primitives not hidden by the occluders can be defined as the potentially visible set for R in step 218.

Figure 6:
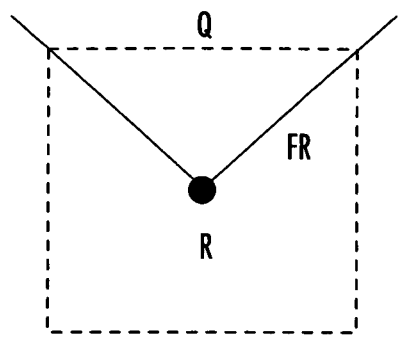
FIG. 6 is a schematic representation of a frustum construction step for a point source that can be used with the methods and systems of the presently disclosed subject matter.

The present technique can be viewed as a generalization of the conservative from-point visibility technique used in the FastV algorithm discussed above. As discussed above, FastV computes from-point visibility by constructing a cubical box around the query point R, then subdividing each of its faces into multiple quad patches Q (where the number of quad patches can be user-specified), and then constructing frusta FR from each quad patch q ∈ Q and R (see FIG. 6). Each of these frusta can be used to compute which portions of the scene are visible from the query point that use the relevant patch as the viewport. Formally, for each q ∈ Q, the set of primitives p ∈ Π can be determined such that there exists a ray from R to some point on p which passes through q.

Given a frustum FR (defined by its corner rays), the FastV algorithm tries to compute a blocker for frustum FR. In the context of FastV, a blocker is defined as a connected set of triangles such that any convex combination of the corner rays of frustum FR intersects some triangle in the blocker. FastV traverses the scene hierarchy, and whenever a triangle T is found that intersects frustum FR, it uses the connectivity information associated with T to determine if some set of triangles connected to T can also be used as a blocker for frustum FR. It is possible that there may be no such triangles. Therefore, once the traversal is completed, FastV returns at most one blocker for frustum FR and zero or more connected sets of triangles in front of the blocker which do not completely block frustum FR.

Figure 7:
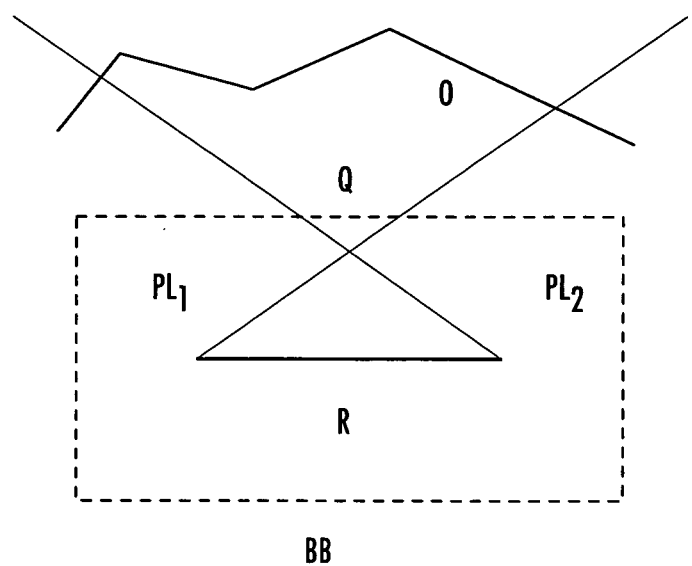
FIG. 7 is a schematic representation of a frustum construction step for a line source that can be used with the methods and systems of the presently disclosed subject matter.

Referring to FIG. 7, the frustum construction approach of FastV can be generalized to the from-region case (i.e., now R can be any convex region). A fattened oriented bounding box BB can be computed (where the amount of "fattening" can be user-specified) that encloses R and subdivide its faces into a user-specified number of quad patches Q. The next step is to determine the set of primitives p such that there exists at least one ray from some point r ∈ R to p which passes through q. Put another way, this step is intended to determine all points from which R is partially visible through q. This corresponds to the region in front of q and bounded by the set of separating planes constructed between R and q. Referring to FIG. 7, separating planes $PL_1$ and $PL_2$ can be constructed between R and Q, and the frustum bounded by these planes can be traced and oriented such that Q is in the interior of the frustum. In this arrangement, O is a blocker for the separating frustum, and is used as an occluder for R.

Note that the separating planes can be oriented such that Q lies in the positive half-space (interior) defined by each separating plane s ∈ S. A separating frustum FR bounded by S can be constructed. The separating frustum need not be pyramidal. Rather, it is defined as the intersection of half-spaces bounded by the separating planes. View frustum culling techniques can be used to cull Π to f to estimate the PVS of R. However, this approach may compute a PVS π such that there exist primitives $p_1, p_2 \in \pi$ where $p_i$ occludes $p_2$ from R, and the resulting PVS would be too conservative. Instead, FastV can be used to trace frustum FR as shown in FIG. 7. Those having skill in the art will recognize that if R is in fact a single point, the occluder selection algorithm reduces to FastV.

Figure 9:
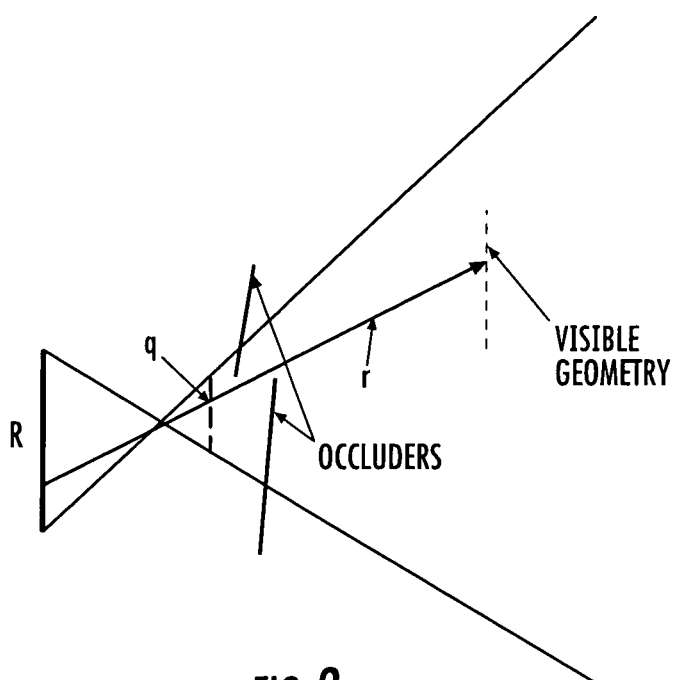

In one embodiment, all the rays that start on R and pass through q can be traced, and the set of primitives reached would approach $\pi_{exact}$. However, tracing using FastV computes a subset of triangles visible from R through Q (i.e., computes $\pi \subseteq \pi_{exact}$). This subtle difference between the from-point and from-region case occurs because using FastV with a separating frustum for a region R is not guaranteed to find all geometry reachable by rays starting on R for a given frustum subdivision level, as is shown in FIG. 9. Therefore, after occluder selection, a conservative occlusion culling algorithm can be used to compute a superset of the exact PVS.

Figure 8:
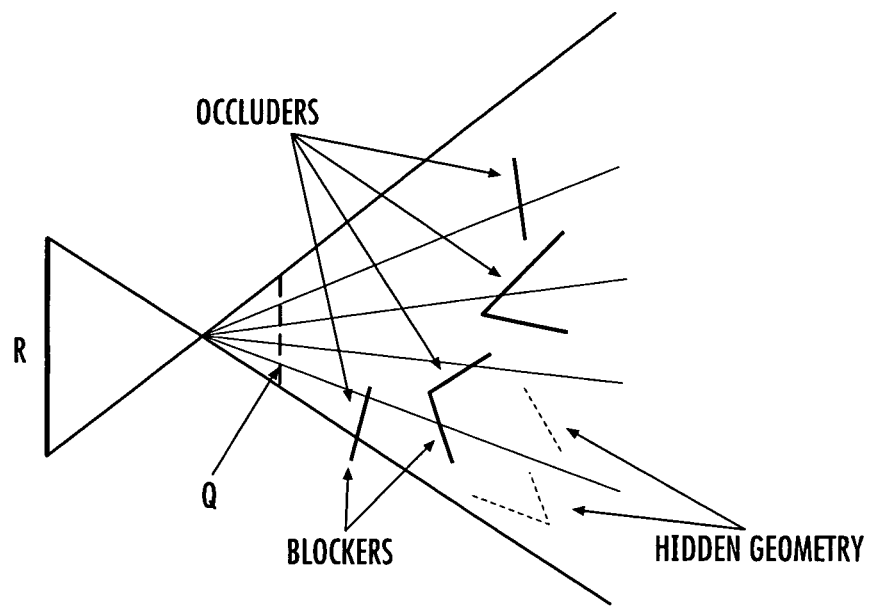
FIGS. 8 and 9 are schematic representations of methods for occluder selection according to embodiments of the presently disclosed subject matter.

Tracing frustum FR using FastV can return a blocker for frustum FR. This blocker is a connected set of triangles such that any ray originating on R and passing through q intersects the blocker. Therefore, all blockers returned by FastV can be used as occluders. However, it is possible that FastV may be unable to find a blocker for frustum FR. In such a case, the connected sets of triangles computed by FastV during scene traversal can be used as occluders, as is shown in FIG. 8.

Given a set of occluders for R, the next step is to perform occlusion culling to compute the PVS of R. In one embodiment the umbra of an occluder o can be determined with respect to R. Unfortunately, the boundary of an exact umbra is bounded by curved surfaces. A common workaround is to compute a shadow frustum bounded by these curved surfaces and use it to determine a subset of triangles occluded by o (thus computing a superset of the exact PVS for R). The shadow frustum is bounded by the supporting planes between R and o and thus can be easily computed.

Although one particular algorithm is described above, any existing object-precision technique can be used for occlusion culling, as long as it guarantees that the resulting PVS is conservative. In the present implementation, a simple CPU-based frustum culling method can be used. For each occluder o, the shadow frustum SF of o from R can be computed, and all primitives behind o and completely contained in SF can be marked as occluded from R. Once all shadow frusta SF have been processed in this manner, the primitives not marked hidden are added to the PVS of R.

Although the above provided one method for identifying the PVS, it should be understood that many other algorithms have also been proposed for conservative from-region visibility. Several algorithms exist for performing occlusion culling with respect to shadow frusta, with different trade-offs and limitations. For example, some conservative algorithms operate in the dual space of rays, by dividing the scene into cells separated by portals and computing stabbing lines through portals.

Image-Space or Sample-Based Visibility

These approaches sample the set of rays in $\Phi$ and compute a PVS, $\pi_{sampling}$, which is hit by only the finite set of sampled rays. Note that since $\pi_{sampling}$ is computed for only a finite subset of rays in $\Phi$, $\pi_{sampling} \subseteq \pi_{exact}$. The choice of sampled rays is governed by the application. Sampling-based methods are widely used in graphics applications due to their computational efficiency and are well supported by current GPUs. Typically, during image generation, an image of a given resolution, say 1K×1K pixels and only a constant number of rays per pixel are sampled to generate an image. Sampling based methods are extensively used in computer graphics for image generation. However, these methods can suffer from spatial and temporal aliasing issues and may require supersampling or other techniques (e.g. filters) to reduce aliasing artifacts.

An example of from-point sample-based visibility is shown in FIG. 2a. Only a few rays are sampled and intersected with the geometric primitives to find the visible primitives. This could lead to spatial aliasing, as shown in FIG. 2a. The primitive P3 is marked as hidden because it lies between two sampled rays even though it is visible from the viewpoint. Despite their short comings sample-based methods are widely used in computer graphics. Efficient implementation of sample-based visibility algorithms can be achieved on current graphics processing units (GPUs). The z-buffer algorithm is a standard sample-based visibility algorithm that is supported by the rasterization hardware in GPUs. Moreover, advanced support for sample-based visibility, such as from-point occlusion queries are also supported in GPUs. Also, sample-based ray shooting techniques have been used in computer graphics.

An example of from-region sample-based visibility is shown in FIG. 3a. Similar to from-point visibility, the sampling in from-region algorithms introduces spatial aliasing. In this case, the primitive P4 is marked as hidden even though there exists at least one ray from the view-region that reaches the primitive P4. Despite this omission, these methods are fast compared to exact and conservative from-region visibility algorithms and can easily be applied to complex models.

These methods have at least one important limitation, though. They sample a finite set of rays originating inside the view-region and thus compute only a subset of the exact solution (i.e., approximate visibility). Therefore, these methods are limited to sampling based applications such as interactive graphical rendering, and may not provide sufficient accuracy for applications where an accurate from-region solution is needed.

Geometric Acoustics and Visibility

New geometric sound propagation algorithms can be based on object-space conservative from-point and from-region visibility techniques. The present geometric sound propagation algorithms are based on the image source method. As originally formulated, the image source method can mainly simulate specular reflections. The most common methods include the image source method, ray tracing, and approximate volume tracing. Of these methods, the image source method is the most accurate, since it is guaranteed to not miss any specular propagation paths between the source and the listener. GA methods are also used for modeling diffuse reflections. The two main techniques of doing so are based on path tracing and radiosity.

Although it is considered relatively more difficult to model diffraction using GA methods (because diffraction involves sound waves bending around objects), it is possible to extend these methods to handle edge diffraction by introducing line or edge image sources. As noted above, the two most commonly used geometric models of diffraction are the Uniform Theory of Diffraction (UTD) and the Biot-Tolstoy-Medwin (BTM) model. The UTD model assumes infinite diffracting edges, an assumption which may not be applicable in real-world scenes (e.g., indoor scenes). However, UTD has been used successfully in interactive applications. BTM, on the other hand, deals with finite diffracting edges, and therefore is more accurate than UTD. It is much more complicated, however, and has only recently been used (with several approximations) in interactive applications.

The choice of visibility algorithm depends on the target application. For instance, room acoustics software requires accurate modeling of early specular reflections and edge diffraction, therefore, exact or conservative object-space visibility algorithms are most suitable. Similarly, for entertainment applications like games it might be possible to use sample-based visibility algorithms as temporal and spatial aliasing issues can be hidden by applying heuristics which reduce the accuracy of the simulation.

Another example is that the cost of computing the diffraction paths and IRs for double or triple diffraction for finite-edge diffraction using the BTM model could be so high that it might be worth looking into exact visibility approaches to compute the smallest PVS from an edge and thus minimize the path validation steps. The exact visibility algorithms are relatively expensive and it is hard to implement them robustly in 3D. However, the savings in the size of the visible set may result in improved overall performance.

Sample-Based Approaches

Due to their simplicity and efficiency, sampling based approaches are very popular in geometric acoustics, but the acoustic space has to be sampled densely to produce a robust solution. Since the sampling based approaches discretely sample the acoustic space, they introduce statistical errors and may miss critical early reflection paths. Many techniques like ray tracing, ray-frustum tracing, and other sample-based techniques have been applied to compute early specular reflection.

In addition, sample-based from-region visibility algorithms have not been used to accelerate finite-edge diffraction. Some recent techniques for sample-based from-region algorithms can be applied on simple scenes, but the impact of sampling needs to be carefully analyzed.

Object-Space Exact Approaches

The size of the visibility tree computed by exact object-space algorithms is guaranteed to be optimal. This improves the time taken by the path validation step since the number of potential paths to validate is the smallest. However, performing exact visibility to compute the visibility tree is compute intensive and may require a long time. Such methods have been applied for early specular reflection for limited scenes with a cell-and-portal structure. Applying these algorithms for early specular reflections for general scenes is computationally expensive and requires a robust implementation.

One possibility is to apply recently developed beam tracing algorithms for early specular reflection. Like sample-based approaches, no known exact object-space from-region has been applied to improve the finite-edge diffraction computation. It is possible to apply aspect graphs, visibility complex to compute from-region visibility from a diffracting edge. However, the computational complexity of such methods— $O(n^9)$ for aspect graphs and $O(n^4)$ for the visibility complex, where n is the number of scene primitives—makes them impractical for even the simple scenes. Moreover, these are global visibility algorithms and compute visibility from all points in the scene; they cannot be used to compute visibility from a given list of diffracting edges.

Object-Space Conservative Approaches

Figure 10A:
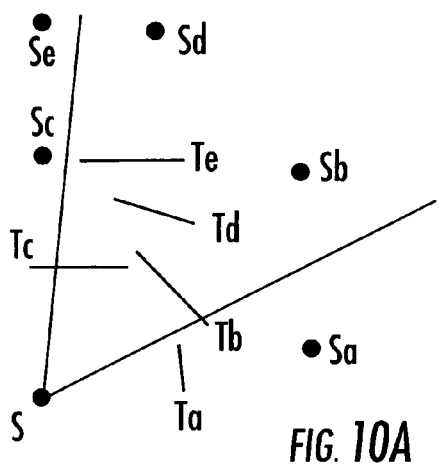
FIGS. 10a-10d are schematic representations of geometric sound propagation approaches that can be used with the methods and systems of the presently disclosed subject matter.
Figure 10B:
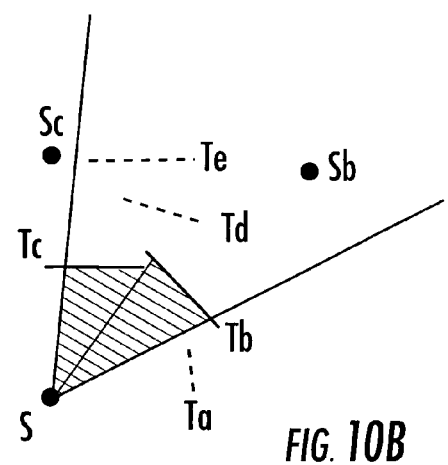
Figure 10C:
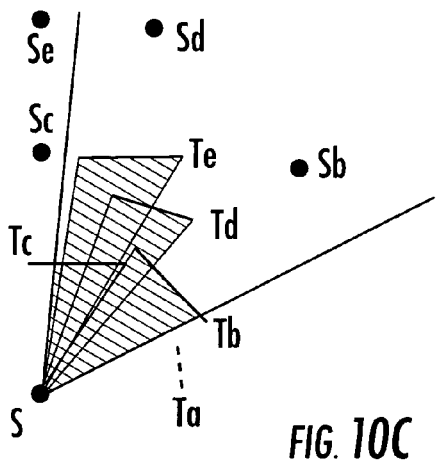
Figure 10D:
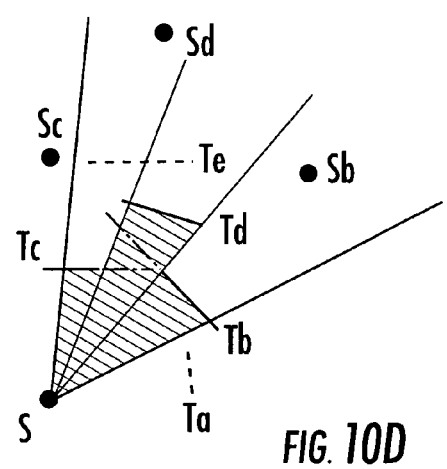

Given the computational complexity of exact approaches and aliasing issues with sampling-based approaches, conservative approaches offer an interesting alternative. Conservative approaches have lower runtime complexity as compared to the exact approaches and do not suffer from the aliasing errors that are common in sample-based approaches. The PVS computed by conservative approaches is larger than that computed by exact or sample-based visibility approaches, however, and therefore the size of visibility tree will be larger. Thus, the path validation step will take longer since there are more paths to validate. FIGS. 10a-10d compare different image-source methods. Given a sound source S and primitives (Ta, Tb, Tc, Td, and Te) the image source method shown in FIG. 10a creates image-sources of S against all primitives in the scene. The beam tracing method shown in FIG. 10b computes image-sources for only exactly visible triangles, Tb and Tc in this case. The accelerated beam tracing approach shown in FIG. 10c computes image-sources for all triangles inside the beam volume (i.e., Tb, Tc, Td, and Te in this case). The present approach is shown in FIG. 10d and computes image-sources for triangles Tb, Tc, and Td.

The main difference between these methods is in terms of which image sources they choose to compute. A naïve image-source method computes image sources for all primitives in the scene. Beam tracing methods compute the image sources for exactly visible primitives from a source (or image source). Methods based on beam tracing, like accelerated beam tracing, compute image sources for every primitive inside the beam volume. The present approach, shown in FIG. 10d, finds a conservative PVS from a source and computes the image sources for the primitives in the conservative PVS. The present approach is based on a conservative from-point and a conservative from-region algorithm to compute early specular reflection and finite-edge diffraction.

Accelerated Beam Tracing, a variant of beam tracing, has also been applied for early specular reflections. Regarding conservative visibility algorithms for finite-edge diffraction, only view-frustum culling has been applied and the present approach for reducing edge pairs for edge diffraction is the only known implementation which uses visibility algorithms for finite edge diffraction.

Sound Scattering

In the previous sections, discussion of accelerating early specular reflections and finite-edge diffraction by applying visibility techniques is presented. However, only modeling specular reflections and finite-edge diffraction is insufficient to accurately predict the acoustics of an environment. Sound scattering (i.e., interaction of sound waves with objects of size comparable to its wavelength), is important to accurately model room acoustics.

The geometric room acoustics can be generalized by an integral equation called the acoustic rendering equation (see Eq. 1 below).

The acoustic rendering equation can be seen as an extension of the rendering equation in computer graphics.

$$L(x', \omega) = L_0(x', \omega) + \int_S R(x, x', \omega) L\left(x, \frac{x'-x}{|x'-x|}\right) dx \quad (1)$$

where L is final outgoing radiance, $L_0$ is emitted radiance, and R is the reflection kernel, which describes how radiance at point x influences radiance at point x':

$$R(x,x',\omega) = \rho(x,x',\omega) G(x,x') V(x,x') P(x,x') \quad (2)$$

Here, ρ is the BRDF of the surface at x, G is the form factor between x and x', V is the point-to-point visibility function, and P is a propagation term that takes into account the effect of propagation delays. The latter is unique to sound rendering as visual rendering algorithms neglect propagation delays due to the high speed of light. Also, depending on the BRDF (or scattering function) of a surface, different scattering properties of the surface (e.g., diffuse reflections) can be modeled.

Several methods have been developed to solve the acoustic rendering equation. Ray tracing is a popular geometric algorithm for acoustic modeling and can model specular and diffuse reflections easily. There has been much research in the computer graphics community to develop fast algorithms for ray tracing, such as by taking advantage of multi-core and many-core architectures, efficient scene hierarchies, and other acceleration techniques. Radiosity is another technique to model sound scattering. These algorithms operate by sampling the surface primitives and computing transfer operators which essentially encode the impulse response due to each sample at every other sample.

Visibility Acceleration

Solving the acoustic rendering equation requires the computation of visibility between two points, V(x,x'). The visibility between two points ban be computed by shooting a ray from one point in the direction of the other. Hierarchies to organize scene geometry can be used to accelerate ray shooting and efficient handle scenes with moving geometries. Another possibility is to use from-region visibility data structures, like visibility complex or aspect graphs, to efficiently compute visibility between two points. These visibility algorithms are computation and memory intensive for large scenes. However, for small scene used in room acoustics it is might be feasible to apply from-region visibility data structures to accelerate sound scattering computations.

Sound Propagation Using Geometric Acoustics

Figure 12A:
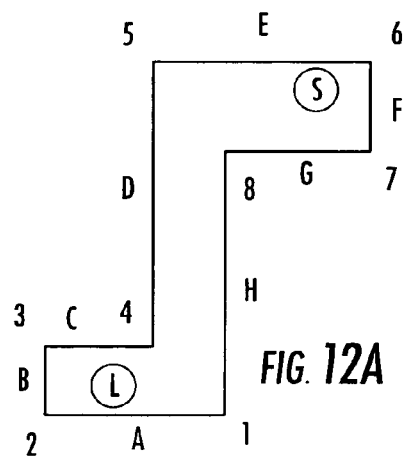
FIGS. 12a-12c are schematic representations of a scene modeled according to an embodiment of the presently disclosed subject matter.

To simulate sound propagation using GA methods, a point sound source, a CAD model with acoustic material properties, diffracting edges, and a listener position can be used to compute an impulse response (IR) of the acoustic space for the source and listener position. The IRs can be used to derive various acoustic parameters of a room. In FIG. 12a, a CAD model (shown in top down view) consists of specular planes A to H and diffracting edges 1 to 8. The positions of source S and listener L are also shown.

Figure 5A:
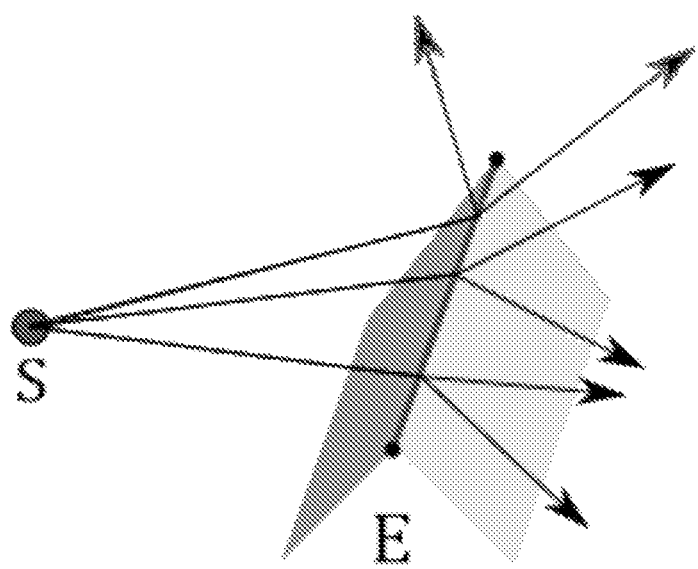
FIG. 5A is a schematic diagram illustrating an image source of a diffracting edge.
Figure 11:
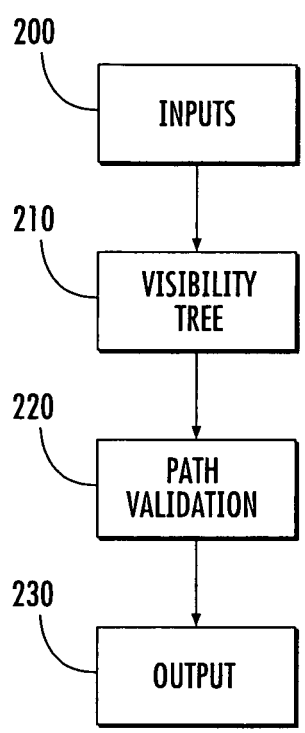
FIG. 11 is a block diagram illustrating an exemplary method for simulating sound propagation within the scene according to an embodiment of the presently disclosed subject matter.

To compute the IR, all the specular and diffraction propagation paths that reach the listener from the source can be computed. To do this, a two-step approach based on the image-source method can be used (see FIG. 11). In a first step 200, inputs for the scene can be provided, such as scene geometry or source and listener positions. Based on these inputs, a second step 210 can comprise constructing a visibility tree VT(S,k) from source S up to a user-specified k orders of reflection, which can include the occluder selection steps discussed above with respect to FIG. 5. Note that only image sources for a source S (or image source) with respect to the triangles and/or edges that are visible to S need to be computed. If S is a point source, for instance, this can involve from-point visibility computation. For example, regarding the image source IS of the source S about plane G in FIG. 12b, only the image sources of IS about planes D, E, and F need to be computed for second order specular reflection from IS. If S is a line or an edge source, however, from-region visibility computation can be performed. Specifically, a from-edge visibility computation can be performed, which computes a superset of all the primitives that can be visible from any point on the edge. For example, as illustrated in FIG. 5A, sound from a source S scatters in all directions upon encountering diffracting edge E. E itself is therefore the image source of S about E. The fact that the rays scatter in all directions from E implies that from region visibility is required to compute all geometry reachable by these rays.

Figure 12B:
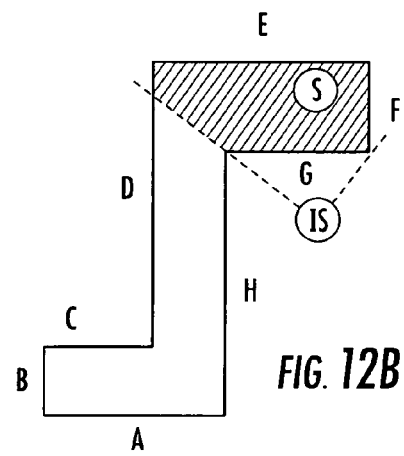
Figure 12C:
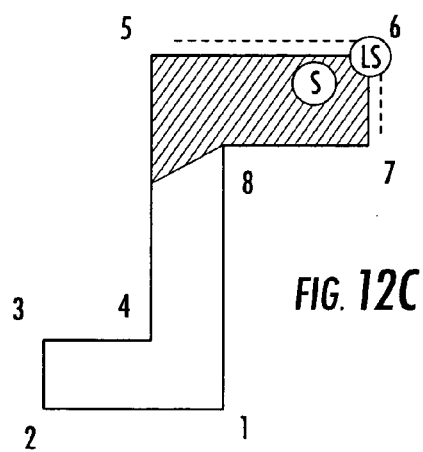
Figure 13:
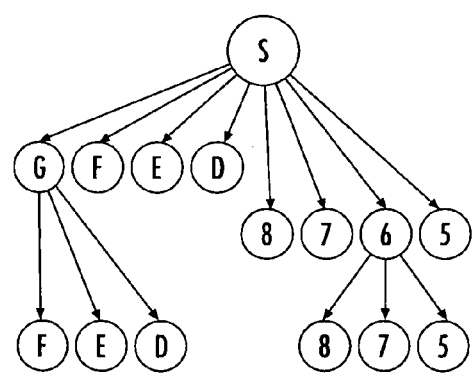
FIG. 13 illustrates a visibility tree that can be used with the methods and systems of the presently disclosed subject matter.

For example, second order diffraction about the line source LS in FIG. 12c can only occur with edges 5, 7, and 8. The visibility algorithms can be applied recursively for point and line image sources to construct the visibility tree. An example visibility tree for the configuration in FIGS. 12a-12c is shown in FIG. 13. Each path in VT(S,k) represents a potential path contributing to the IR. Each path consists of a sequence of (up to k) triangles and/or edges that a ray starting from S reflects and/or diffracts about as it reaches the listener at the position L. For example, S→G→E denote all specular paths from the source that bounces off planes G and then E. Similarly, S→6→7 denote all diffraction paths from the source that hit edge 6 and then edge 7.

Figure 14A:
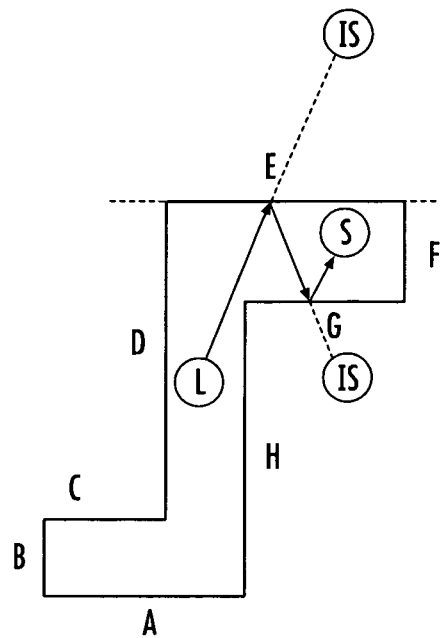
FIGS. 14a and 14b are schematic representations of path validation approaches that can be used with the methods and systems of the presently disclosed subject matter.
Figure 14B:
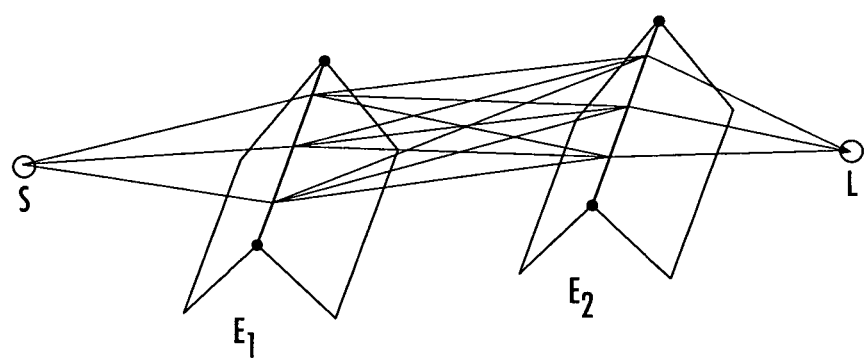

To compute the final path from visibility tree, however, a listener position is required. Thus, in the second step, given a listener position L, a listener node can be attached to every node in the tree, and for each potential path in VT(S,k), it can be determined which of the propagation paths are valid. Thus, validating S→G→E→L means finding a specular path from source that bounces off plane G and then plane E and then reaches the listener (FIG. 14a). Similarly, validating S→6→7→L means finding multiple paths from the source that hit edge 6 followed by edge 7 and then reach the listener (FIG. 14b). It is possible that some of the paths are blocked by other primitives in the scene and may not contribute to the IR. The second step can be referred to as path validation.

Image Source Method

Alternatively, given a point source S and a listener L, ray shooting can be used to check if a direct path exists from S to L. The basic idea behind the image source method is as follows. For a specular reflector T (in the present case, a triangle), a specular path S→T→L exists if and only if a direct path exists from the image of S formed by T, to L, and this direct path also passes through T. In the absence of any visibility information, image sources need to be computed about every triangle in the scene. This process can be applied recursively to check for higher order specular paths from S to L, but the complexity can increase exponentially as a function of the number of reflections.

For a given source position, this process can be accelerated by applying from-point visibility techniques. It is noted that first order image sources only need to be computed about triangles visible to S. For a first-order image source $S_1$, second-order image sources only need to be computed for the triangles that are visible to $S_1$ through T, and so on for higher order image sources.

BTM Based Finite-Edge Diffraction

Analogous to how specular reflection about a triangle is modeled by computing the image of the source with respect to the triangle, diffraction about an edge is modeled by computing the image of the source with respect to the edge. The key idea is that the image source from a point source S with respect to diffracting edge E is that edge E itself. This means that image sources can now be points or line segments. It is further noted that the image of a point or line source $S_i$ about a planar specular reflector T is obtained by reflecting $S_i$ across the plane of T.

For a given edge source, the basic approach described above can be accelerated by applying from-region visibility techniques. Note that second-order diffraction image sources for an edge source $S_i$ need to be computed for edges that are visible from $S_i$. Also, specular reflections of $S_i$ need to be computed from triangles that are visible from $S_i$.

Results

Table 1 below summarizes the present results on early specular Tracing (ABT) algorithm, which is another conservative from-point visibility algorithm. Specular reflection results using the present methods and systems were obtained on models of complexity ranging from 438 triangles to 212K triangles. The performance on three benchmarks is also tested, and the timings for constructing the visibility tree is compared using both the present approach and ABT.

TABLE 1

| Model | Triangles | Time (sec) | Speed Up (ABT) |
| --- | --- | --- | --- |
| Room | 438 | 0.16 | 10.1 |
| Regular Room | 1190 | 0.93 | 22.2 |
| Complex Room | 5635 | 6.50 | 11.8 |
| Sibenik Cathedral | 78.2K | 72.00 | — |
| Trade Show | 212K | 217.60 | — |

As can be seen from this data, which outlines the performance of sound propagation algorithms for three orders of reflection on a single core, a 10-20× speedup can be observed for the simple models over accelerated beam tracing (ABT).

Figure 15:
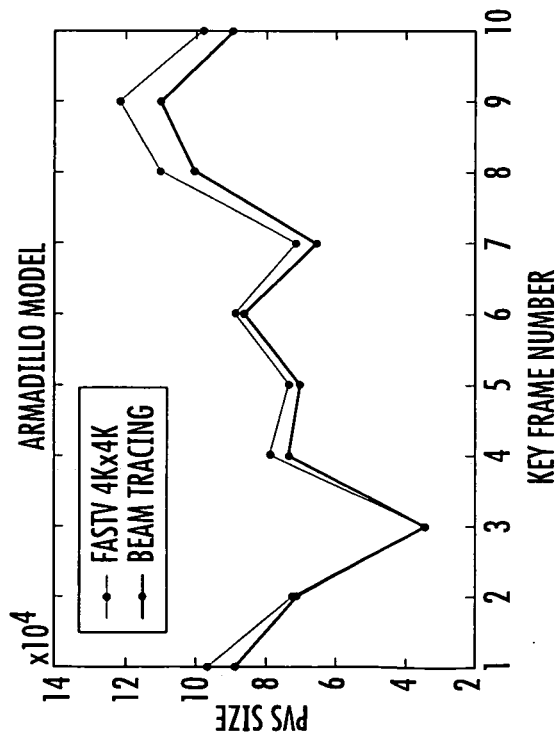
FIG. 15 is a graph comparing the potentially visible set of primitives computed by a beam tracer algorithm against an algorithm based on the methods and systems of the presently disclosed subject matter.

Two additional complex benchmarks can be used with 80K and 212K triangles. It is believed that there is not any other implementation of the image source method that can handle models of such complexity in tractable time. The performance of the present visibility algorithm can also be compared with a fast beam tracing algorithm, with the size of the PVS computed by the present methods converging to within 1-10% of the exact from-point beam tracing PVS (see FIG. 15). Thus, in terms of performance, the application of the present methods and systems is about 5-8 times faster on a single CPU core on the tested model as compared to conventional methods.

Table 2 below highlights the results on finite-edge diffraction. The performance of the present visibility tree construction step (using from-region visibility) is compared against visibility tree construction using only view-frustum culling (as applied in the MATLAB Edge Diffraction toolbox). The time required to build the visibility tree is compared as well as the size of the tree constructed for each approach.

TABLE 2

| Scene | Triangles | Edges | Second order diffraction paths in tree | | | Path validation |
|---|---|---|---|---|---|---|
| | | | Present method | MATLAB | Size reduction | Speedup |
| Factory | 170 | 146 | 4424 | 12570 | 2.84 | 1.93 |
| Room | 876 | 652 | 43488 | 181314 | 4.17 | 3.23 |
| House | 1105 | 751 | 133751 | 393907 | 2.95 | 13.74 |

From these results, it can be seen that using from-region visibility to reduce second order diffraction paths between mutually invisible edges can have significant benefits. In addition, the speedup caused during path validation by this reduction in the size of the visibility tree is likewise significant.

Table 3 below shows the breakdown of time spent in each step of the present algorithm. Specifically, Table 3 shows both the time spent in constructing a visibility tree (averaged over multiple source positions) and the time taken to compute the final IR (averaged over multiple source and listener positions.

TABLE 3

| Scene | Visibility Tree (ms) | IR Computation (s) |
|---|---|---|
| Factory | 141.0 | 23.9 |
| Room | 747.6 | 10.4 |
| House | 1045.6 | 24.3 |

Figure 16A:
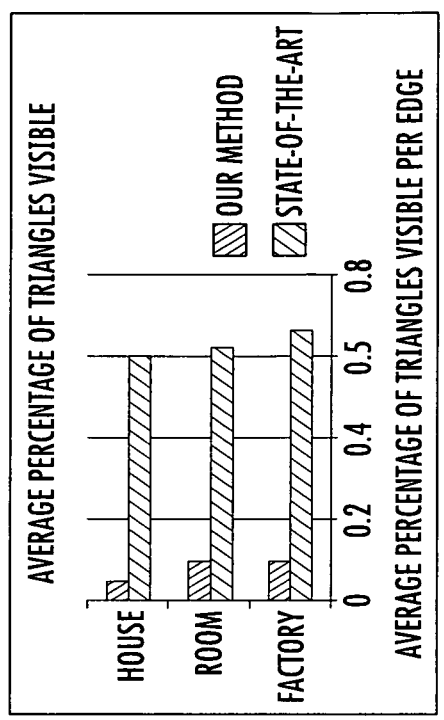
FIGS. 16a and 16b are charts comparing an average amount of visible geometry returned by previous methods against the methods and systems of the presently disclosed subject matter.
Figure 16B:
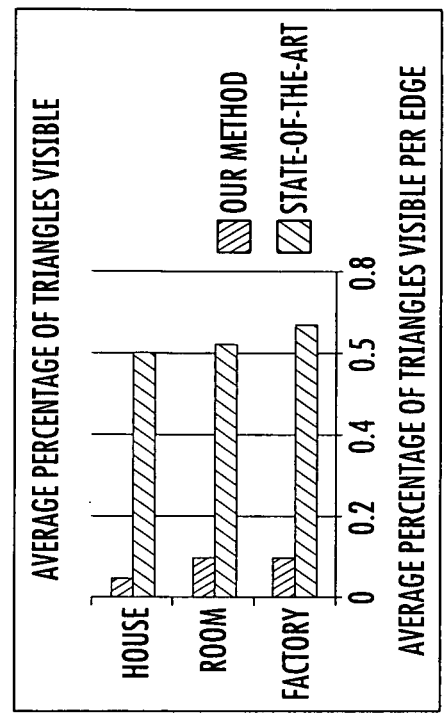

It is evident from the table that the "costliest" step of the present algorithm is the final IR computation as the path validation for edge diffraction requires shooting millions of rays. Constructing the visibility tree is much faster by comparison. FIGS. 16a and 16b show the average percentage of total triangles (and diffracting edges) visible from the diffracting edges in various benchmark scenes. These plots clearly show that even in simple scenes, which are typically used for interactive sound propagation, the use of visibility algorithms helps reduce the complexity of the visibility tree computed by the present algorithm by a factor of 2 to 4.

Regarding occluder Selection for from-region visibility, running times of the present occluder selection step per triangle is presented in in Table 4. The table further reports the average size of each occluder (in terms of the number of triangles) returned by the occluder selection algorithm.

TABLE 4

| | | Occluder Selection | |
|---|---|---|---|
| Scene | Triangles | Time (s) | Avg. triangles per occluder |
| Floor | 7.3K | 0.12 | 6.0 |
| Building | 69K | 1.3 | 3.0 |
| Soda Hall | 1.5M | 14.8 | 6.7 |

This data demonstrates how the present occluder selection algorithm is able to effectively combine connected triangles into larger occluders. This results in larger occluders, which can potentially allow more triangles to be culled. Moreover, the computational cost of state-of-the-art from-region occlusion culling algorithms tends to increase with an increase in the number of occluders. The time required for such computations can be reduced by using fewer, larger occluders formed by connected sets of triangles, such as those selected by our algorithm.

Table 5 compares the total running time for from-region visibility (occluder selection and occlusion culling) and the resulting PVS sizes when our occlusion culling implementation is provided with occluders computed using three approaches: no occluder selection (i.e., using all primitives as occluders), area-ratio heuristics, and the present occluder selection algorithm based on tracing separating frusta.

TABLE 5

| | | No Occluder Selection | | Area Ratio Heuristic | | Tracing Separating Frusta | |
|---|---|---|---|---|---|---|---|
| Scene | Triangles | Time (ms) | PVS Size | Time (ms) | PVS Size | Time (ms) | PVS Size |
| Factory | 170 | 15.2 | 64 | 14.9 | 64 | 11.5 | 69 |
| Room | 876 | 240 | 356 | 241.4 | 356 | 102 | 379 |
| House | 1150 | 192 | 209 | 112.2 | 261 | 90 | 350 |

This table shows that using the occluder selection algorithm discussed above can significantly reduce total time spent in visibility computation as compared to the other approaches, at the cost of a relatively small increase in PVS size. It is noted that when selecting occluders using the area-ratio heuristic, the area-ratio is evaluated for each primitive and all primitives whose scores are greater than or equal to the median score are chosen as occluders.

Figure 17A:
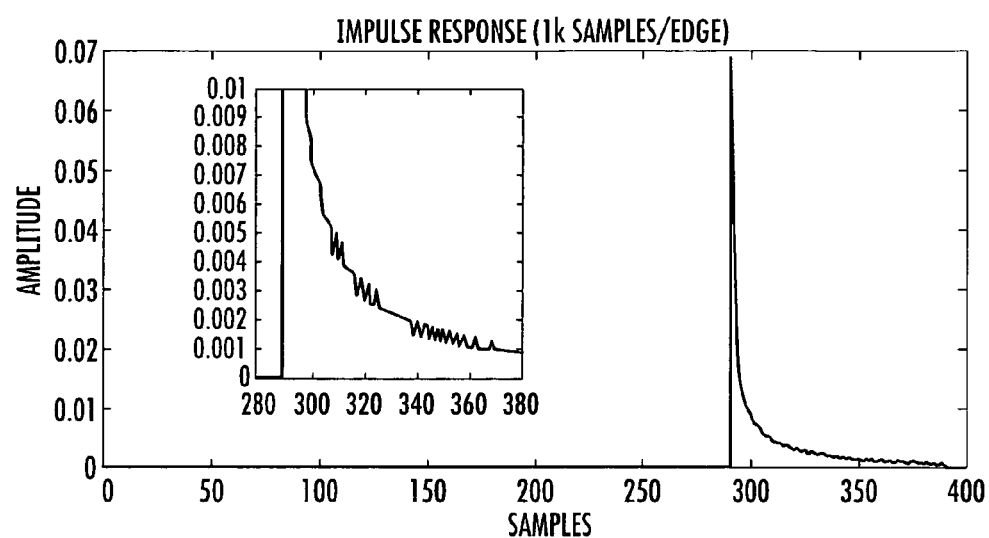
FIGS. 17a-17d are graphs of impulse responses computed for diffraction about a simple double wedge for increasing numbers of samples per edge.
Figure 17B:
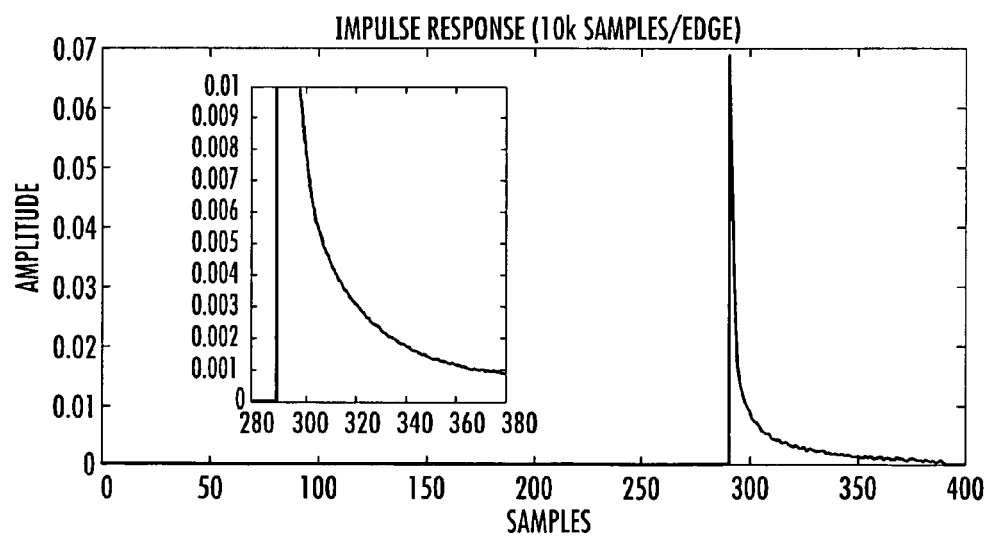
Figure 17C:
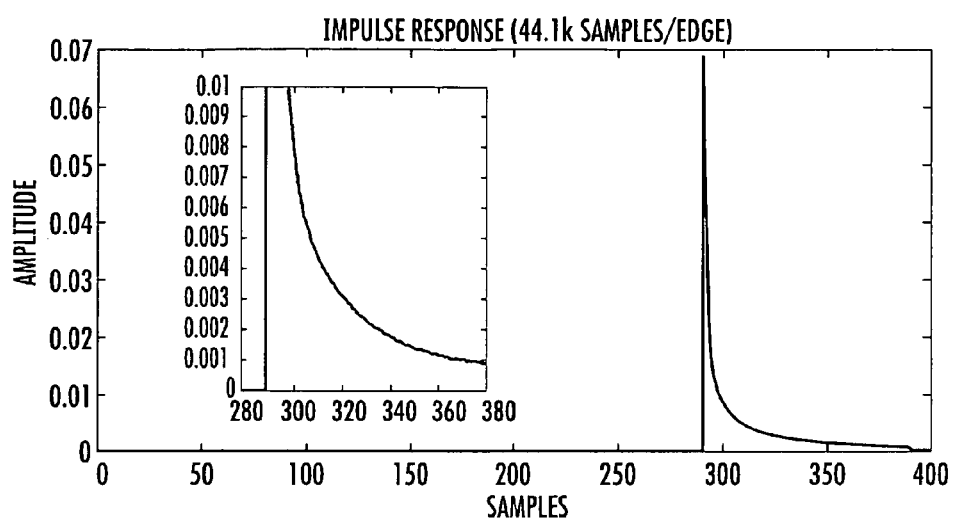
Figure 17D:
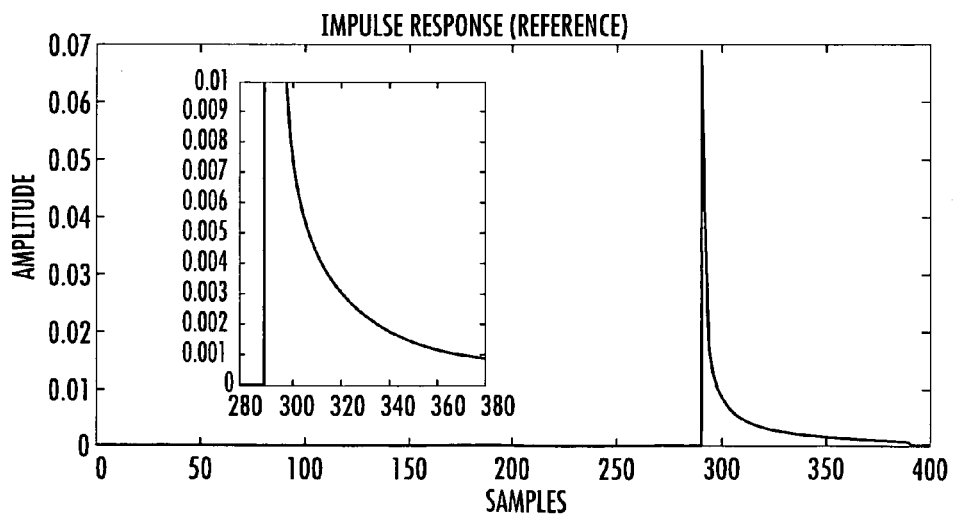

Regarding impulse responses, the methods and systems according to the present subject matter implement the line integral formulation of the BTM model for performing path validation and computing impulse responses. One parameter in the validation step is the number of samples each edge is divided into. A higher number of samples per edge results in more accurate evaluation of the BTM integral at a higher computational cost. FIGS. 17a through 17c show impulse responses computed for diffraction about a simple double wedge for increasing numbers of samples per edge. Specifically, FIG. 17a shows the impulse response with 1K samples per edge, FIG. 17b shows the impulse response with 10K samples per edge, and FIG. 17c shows the impulse response with 44K samples per edge. As can be seen from the figures, increasing the number of samples causes the IRs to converge to the reference IR computed by a reference method (MATLAB Edge Diffraction toolbox), which is shown in FIG. 17d for comparison.

It is further noted that although the computational cost of the BTM model remains higher than that of the UTD model, those having skill in the art will recognize that the BTM model is more accurate than UTD model at low frequencies, where diffraction plays an important role. Furthermore, the UTD approach does not model the diffraction contributions in regions where the listener is in line-of-sight of the source, whereas the BTM approach does. At low frequencies, numerical methods can be used to capture diffraction effects, but the complexity scales with the volume of the scene, as opposed to BTM-based methods whose complexity scales with the number of diffracting edges. Moreover, combining a numerical acoustics algorithm with geometric acoustics techniques for high frequency simulations remains a challenging problem, whereas the BTM approach can easily be combined with the image source method to compute accurate diffraction effects.

The subject matter described herein for simulating sound propagation in a scene can be implemented using a non-transitory computer readable medium having stored thereon executable instructions that when executed by the processor of a computer control the computer to perform steps. Exemplary computer readable media suitable for implementing the subject matter described herein can include chip memory devices, disk memory devices, programmable logic devices, and application specific integrated circuits. In addition, a computer readable medium for implementing the subject matter described herein may be located on a single device or computing platform or may be distributed across plural devices or computing platforms.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for simulating sound propagation, the method comprising:
    defining a sound source position within a modeled scene having a given geometry;
    constructing a visibility tree for modeling sound propagation paths within the scene;
    using a from-region visibility technique to model sound diffraction within the scene and reduce the size of the visibility tree, wherein using the from-region visibility technique to model sound diffraction includes performing a from-edge visibility computation, which includes, for each edge in the scene visible from the source, computing a superset of all other edges in the scene visible in any direction from any point on the edge by scattering rays in all directions into the scene from each point on the edge and identifying the other edges impacted by the rays, wherein the superset of edges for a given edge comprises all of the other edges impacted by the rays scattered from the given edge;
    using a from-point visibility technique to model specular sound reflections within the scene and reduce the size of the visibility tree;
    using the visibility tree to determine the impulse response for the scene; and
    using the impulse response to simulate sound propagation in the scene.

2. The method of claim 1, wherein constructing the visibility tree comprises identifying at least one path corresponding to a sequence of surfaces and/or edges that can be encountered by a ray propagating from the sound source.

3. The method of claim 2, wherein constructing the visibility tree comprises limiting a number of specular sound reflections and/or edge diffractions for each path from the sound source.

4. The method of claim 1, wherein reducing the size of the visibility tree using the from-region visibility technique comprises:
    identifying one or more potential sound diffraction paths in the scene; and
    removing branches from the visibility tree that correspond to invalid sound diffraction paths.

5. The method of claim 4, wherein removing branches from the visibility tree that correspond to invalid sound diffraction paths comprises removing branches that correspond to occluded sound diffraction paths.

6. The method of claim 5, wherein removing branches that correspond to occluded sound diffraction paths comprises using conservative visibility techniques to identify a potentially visible set of sound propagation paths that contains at least sound propagation paths that are visible from a given viewing region.

7. The method of claim 6, wherein using conservative visibility techniques comprises constructing shadow frusta for selected occluders.

8. The method of claim 1, wherein reducing the size of a visibility tree using the from-point visibility technique comprises:
    identifying one or more potential sound reflection paths among surface elements in the model;
    identifying invalid paths among the one or more potential sound reflection paths; and
    removing, from the visibility tree, branches corresponding to invalid sound reflection paths.

9. The method of claim 8, wherein removing branches from the visibility tree that correspond to invalid sound reflection paths comprises removing branches that correspond to occluded sound reflection paths.

10. The method of claim 9, wherein removing branches that correspond to occluded sound reflection paths comprises using conservative visibility techniques which perform occlusion culling to identify a potentially visible set that contains at least the sound propagation paths that are visible from a given view point.

11. The method of claim 10, wherein using conservative visibility techniques comprises using one or more of view-frustum culling or back-face culling.

12. The method of claim 1, comprising:
    defining a listener position within the modeled scene;
    traversing the visibility tree to determine which propagation paths are valid between the sound source and the listener position; and
    removing branches from the visibility tree that correspond to invalid sound diffraction paths.

13. The method of claim 1 comprising modeling edge diffraction in the scene using a Biot-Tolstoy-Melvin (BTM) model.

14. The method of claim 1 wherein the scene is free from cells or portals.

15. A non-transitory computer readable medium having stored thereon executable instructions that when executed by the processor of a computer control the computer to perform steps comprising:
   defining a sound source position within a modeled scene having a given geometry;
   constructing a visibility tree for modeling sound propagation paths within the scene;
   using a from-region visibility technique to model sound diffraction within the scene and reduce the size of the visibility tree, wherein using the from-region visibility technique to model sound diffraction includes performing a from-edge visibility computation, which includes, for each edge in the scene visible from the source, computing a superset of all other edges in the scene visible in any direction from any point on the edge by scattering rays in all directions into the scene from each point on the edge and identifying the other edges impacted by the rays, wherein the superset of edges for a given edge comprises all of the other edges impacted by the rays scattered from the given edge;
   using a from-point visibility technique to model specular sound reflections within the scene and reduce the size of the visibility tree;
   using the visibility tree to determine the impulse response for the scene; and
   using the impulse response to simulate sound propagation in the scene.

16. The computer readable medium of claim 15, comprising:
   defining a listener position within the modeled scene;
   traversing the visibility tree to determine which propagation paths are valid between the sound source and the listener position; and
   removing branches from the visibility tree that correspond to invalid sound diffraction paths.

17. The non-transitory computer readable medium of claim 15 comprising modeling edge diffraction in the scene using a Biot-Tolstoy-Melvin (BTM) model.

18. The non-transitory computer readable medium of claim 15 wherein the scene is free from cells or portals.

19. A system for simulating sound propagation, the system comprising:
   a processor;
   a fast geometric sound simulator implemented by the processor for defining a sound position within a modeled scene having a given geometry, for constructing a visibility tree for modeling sound propagation paths within the scene, for using a from-region visibility technique to model sound diffraction within the scene and reduce the size of the visibility tree, wherein using the from-region visibility technique to model sound diffraction includes performing a from-edge visibility computation, which includes, for each edge in the scene visible from the source, computing a superset of all other edges in the scene visible in any direction from any point on the edge by scattering rays in all directions into the scene from each point on the edge, for using a from-point visibility technique to model specular sound reflections within the scene and reduce the size of the visibility tree, and for using the visibility tree to generate an impulse response for the model and identifying the other edges impacted by the rays, wherein the superset of edges for a given edge comprises all of the other edges impacted by the rays scattered from the given edge; and
   a sound source for generating an input sound to the scene, wherein the sound simulator uses the impulse response to simulate a response of the scene to the input sound.

20. The system of claim 19, wherein the fast geometric sound simulator is embodied in a computer readable medium.

21. The system of claim 19, wherein the sound source is movable within the scene.

22. The system of claim 19 comprising modeling edge diffraction in the scene using a Biot-Tolstoy-Melvin (BTM) model.

23. The system of claim 19 wherein the scene is free from cells or portals.

\* \* \* \* \*